(12) United States Patent
Kuroki

(10) Patent No.: US 9,954,426 B2
(45) Date of Patent: Apr. 24, 2018

(54) MOTOR DRIVING DEVICE HAVING PWM CONVERTER

(71) Applicant: FANUC CORPORATION, Minamitsuru-gun, Yamanashi (JP)

(72) Inventor: Wataru Kuroki, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/196,287

(22) Filed: Jun. 29, 2016

(65) Prior Publication Data

US 2017/0005606 A1 Jan. 5, 2017

(30) Foreign Application Priority Data

Jul. 3, 2015 (JP) ................................. 2015-134628

(51) Int. Cl.
| | |
|---|---|
| *H02P 27/00* | (2006.01) |
| *H01H 31/12* | (2006.01) |
| *H02M 1/00* | (2006.01) |
| *H02M 1/32* | (2007.01) |
| *H02M 5/458* | (2006.01) |
| *G01R 31/34* | (2006.01) |

(52) U.S. Cl.
CPC ............... *H02M 1/00* (2013.01); *H02M 1/32* (2013.01); *H02M 5/4585* (2013.01); *G01R 31/343* (2013.01); *H02P 2201/03* (2013.01)

(58) Field of Classification Search
None
See application file for complete search history.

(56) References Cited

U.S. PATENT DOCUMENTS

2006/0158197 A1* 7/2006 Horikoshi ............ G01R 31/343
324/551

FOREIGN PATENT DOCUMENTS

| JP | 09163639 A | 6/1997 |
|---|---|---|
| JP | 2000-236679 A | 8/2000 |
| JP | 2004344946 A | 12/2004 |
| JP | 2008136312 A | 6/2008 |
| JP | 4917680 B | 2/2012 |
| JP | 2013009524 A | 1/2013 |
| JP | 2013240909 A | 12/2013 |

* cited by examiner

*Primary Examiner* — Bentsu Ro
*Assistant Examiner* — Zemenay Truneh
(74) *Attorney, Agent, or Firm* — RatnerPrestia

(57) ABSTRACT

A motor driving device includes, a PWM converter that performs power conversion between AC power and DC power in a DC link, an inverter that converts the DC power in the DC link to AC power for a motor and that converts the AC power from the motor to DC power for returning to the DC link, a power storage unit that stores the DC power, a switch that connects or disconnects between an AC power supply and the PWM converter in response to a command, and a command unit that continues outputting a connection command to the switch while a DC voltage in the DC link is boosted up to a prescribed voltage by the DC power, and that initiates outputting a disconnection command to the switch after the DC voltage in the DC link reaches the prescribed voltage and before the inverter initiates powering operation.

6 Claims, 10 Drawing Sheets

MOTOR OUTPUT

POWER SUPPLY CURRENT

CURRENT FLOWING IN POWER STORAGE UNIT

DC LINK VOLTAGE (VOLTAGE IN POWER STORAGE UNIT)

CONNECTION STATE BETWEEN PWM CONVERTER AND AC POWER SUPPLY

MOTOR OUTPUT

POWER SUPPLY CURRENT

POWER STORAGE DEVICE CURRENT

DC LINK VOLTAGE (POWER STORAGE DEVICE VOLTAGE)

MOTOR DRIVING DEVICE HAVING PWM CONVERTER

BACKGROUND OF THE INVENTION

1. Field of the Invention

The present invention relates to a motor driving device that converts AC power supplied from an AC power supply side to DC power and outputs the DC power to a DC link, and thereafter, further converts the DC power to AC power for motor driving and supplies the AC power to a motor. In particular, the present invention relates to a motor driving device having a PWM converter as a power converter for converting AC power on the AC power supply side to DC power.

2. Description of the Related Art

In a motor driving device that drives a motor within machine tools, forging machines, injection molding machines, industrial machinery, or various robots, AC power supplied from the AC power supply side is temporarily converted to DC power and thereafter is further converted to AC power, and the AC power thus obtained is used as driving power for a motor provided for each drive axis. The motor driving device includes a converter (rectifier) that rectifies AC power supplied from the AC power supply side to output DC power, and an inverter (reverse converter) that is connected with a DC link, which is the DC side of the rectifier, and that performs power conversion between DC power in the DC link and AC power as driving power for or regenerative power from the motor, wherein the speed and torque of the motor connected to the AC side of the inverter, or the position of a rotor are controlled. A capacitor is provided in the DC link, which connects the DC side of the converter and the DC side of the inverter. The capacitor has a function as a smoothing capacitor for suppressing the ripple components of the DC output of the converter, and a function as a power storage device that may store DC power. The same number of inverters are provided as the number of motors, in order to drive-control the motors by supplying the driving power to the individual motors respectively provided correspondingly to the plurality of drive axises. A single converter is generally provided for the plurality of inverters, in order to reduce the cost of the motor driving device and the space occupied.

In recent years, as a converter in a motor driving device, a PWM control type converter (hereinafter, simply referred to as a PWM converter) that enables regenerative power generated during motor deceleration to be returned to the AC power supply side has been widely used, in view of the demand for saving energy. The PWM converter has a power factor of approximately 1 and is advantageous in that a DC voltage in a DC link can be boosted up to a desired voltage equal to or more than an input voltage peak value of an AC power supply. The PWM converter is constituted of a bridge circuit having semiconductor switching elements and diodes connected in reverse parallel therewith, and performs power conversion between AC power on the AC power supply side and DC power in the DC link side with switching operations of the semiconductor switching elements therein being PWM-controlled. Regenerative power generated in a motor during deceleration of the motor is converted from AC power to DC power by an inverter, and the DC power is input to the PWM converter via the DC link and is further converted to AC power by the PWM converter, thereby being regenerated to the AC power supply side. At this time, the DC voltage in the DC link where a capacitor is provided varies corresponding to the amount of regenerative power generated in the motor and the amount of AC power regenerated to the AC power supply side via the inverter, the DC link and the PWM converter.

As described in, for example, Japanese Unexamined Patent Publication No. 2000-236679, there is known a motor driving device wherein a power storage device is provided in the DC link side of a PWM converter, the magnitude of input current (input power) to be fed from an AC power supply to the PWM converter by PWM control is limited, the peaks of power to be supplied from the AC power supply are suppressed by use of energy stored in the power storage device for accelerating a motor, and during deceleration of the motor, the peaks of power to be regenerated to the AC power supply side are suppressed, thereby achieving reduction in the capacity of the PWM converter.

In the motor driving device, when driving power necessary for motor acceleration is denoted by X[W] and a limit value of input power (corresponding to input current) to be fed from the AC power supply to the PWM converter by PWM control is denoted by Y[W], power is short by Z[W] (=X[W]−Y[W]) for motor driving but is supplied from the power storage device for the short power Z[W]. When a time period for accelerating the motor is denoted by T[s], energy E[J] to be supplied as the driving power for the motor from the power storage device is represented by expression (1).

$$E = Z \times T \quad (1)$$

When the driving power for the motor is supplied from the power storage device, a DC voltage (power storage device voltage) in the DC link drops. When a DC voltage in the DC link before the supply of the driving power for the motor from the power storage device is denoted by $V_1[V]$, a dropped DC voltage in the DC link after the supply of the driving power for the motor from the power storage device is denoted by $V_2[V]$, and a capacitance of a capacitor as the power storage device is denoted by C[F], relational expression (2) holds.

$$E = \frac{1}{2} \times C \times (V_1^2 - V_2^2) \quad (2)$$

In addition, as described in, for example, Japanese Patent Publication No. 4917680, there is a motor driving device wherein a power storage device is charged with power from the AC power supply or regenerative power generated during motor deceleration, for the amount of DC voltage in the DC link (power storage device voltage) that has dropped when energy stored in the power storage device is used for motor acceleration, and the energy thus stored in the power storage device is used as driving power for next motor acceleration.

It is possible by PWM control to limit input current to be fed from the AC power supply side to a PWM converter only when the DC voltage in the DC link, which is the DC side of the PWM converter (i.e., power storage device voltage), is higher than an input voltage peak value on the AC power supply side of the PWM converter.

However, when the DC voltage in the DC link drops down to be equal to or lower than the input voltage peak value, current flows into diodes connected in reverse parallel with semiconductor switching elements and therefore the configuration is equivalent to that of a diode rectification-type converter. Consequently, even performing PWM control on switching operations of the semiconductor switching elements does not make it possible to limit the input current to be fed from the AC power supply side. Therefore, when motor acceleration is continued afterwards, all of the power necessary for the motor acceleration has to be fed from the AC power supply side and this makes it impossible to achieve the objective of suppressing the peaks of the power supplied from the AC power supply. In addition, since it may be impossible to limit the input current to be fed from the AC power supply side, there is a risk of breakage of the diodes in the PWM converter or the power storage device due to overcurrents.

FIGS. 10A to 10D are diagrams illustrating operation of a conventional motor driving device having a power storage device and a PWM converter that is provided in order to suppress the peaks of power to be supplied from the power supply during acceleration of the motor and the peaks of power to be regenerated to the power supply during deceleration of the motor, FIG. 10A illustrating a motor output, FIG. 10B illustrating a power supply current to be fed from the AC power supply to the PWM converter, FIG. 10C illustrating current flow in the power storage device, and FIG. 10D illustrating a DC link voltage.

Firstly, a case in which a DC voltage in a DC link has already been boosted up to an input voltage peak value of an AC power supply at time $t_0$ is considered. In FIG. 10D, $V_1$ represents a DC voltage in the DC link before driving power for the motor is supplied from the power storage device. $V_2$ represents a dropped DC voltage in the DC link after the supply of the driving power for the motor from the power storage device and is set to a value larger than the input voltage peak value of the AC power supply side.

During a period between time $t_0$ and time $t_1$, the PWM converter converts AC power on the AC power supply side to DC power, while being PWM-controlled in a manner such that a power supply current (AC current) to be fed from the AC power supply does not exceed a preset input current limit value (FIG. 10B). The power storage device is charged with the DC power output from the PWM converter (FIG. 10C), and the DC voltage in the DC link (i.e. power storage device voltage) gradually increases (FIG. 10D).

After the DC voltage in the DC link reaches a prescribed voltage $V_1$ at time $t_1$, neither the power supply current (FIG. 10B) nor the power storage device current (FIG. 10C) flows until motor acceleration is started.

When motor acceleration is started at time $t_2$ (FIG. 10A), the power supply current (input current) that is fed to the PWM converter from the AC power supply increases (FIG. 10B). No power storage device current flows (FIG. 10C) until the power supply current reaches the input current limit value.

When powering of the motor continues and the motor output continues increasing (FIG. 10A) even though the power supply current has reached the input current limit value at time $t_3$ (FIG. 10B), the limited input power to be supplied from the AC power supply side is not enough for the driving power and, as a result, the shortage of the power is compensated by the power discharged from the power storage device. Accordingly, the power storage device current flows (FIG. 10C) and the DC voltage in the DC link (i.e. power storage device voltage) gradually decreases (FIG. 10D).

If the DC link voltage is greater than the input voltage peak value of the AC power supply when the motor output further continues increasing even though the DC link voltage falls below $V_2$ at time $t_4$, it is possible to limit by PWM control the magnitude of the input current to be fed from the AC power supply side to the PWM converter (FIG. 10B).

When the motor output further continues increasing even though the DC link voltage falls below the input voltage peak value at time $t_5$, current flows through the diodes in the PWM converter and, as a result, it is impossible to limit the magnitude of the input current to be fed from the AC power supply side. Accordingly, breakage of the diodes in the PWM converter or the power storage device may occur due to overcurrents, or in order to avoid this, the motor driving device itself may be stopped by alarm.

In the above-described motor driving device having the PWM converter and the power storage device, it is important to perform control such that the DC voltage in the DC link that has dropped after the supply of the driving power for the motor from the power storage device ($V_2[V]$ in expression 2) does not fall below the input voltage peak value on the AC power supply side.

For example, such control is conventionally performed that the dropped DC voltage in the DC link ($V_2[V]$ in expression 2) does not fall below the input voltage peak value on the AC power supply side by designing a capacitance $C[F]$ of a capacitor as the power storage device based on expression 1 and expression 2 as follows. In other words, the DC voltage $V_1[V]$ in the DC link before the supply of the driving power for the motor from the power storage device is set equal to or lower than withstand voltages of the diodes in the PWM converter and the power storage device, and the dropped DC voltage $V_2[V]$ in the DC link after the supply of the driving power for the motor from the power storage device is set to a value greater than the input voltage peak value on the AC power supply side and equal to or greater than a minimum voltage necessary for driving the motor. As for driving power $X[W]$ necessary for motor acceleration and a time period $T[s]$ during which the motor is accelerated are determined based on motor operation conditions, and a limit value $Y[W]$ of the input power (corresponding to the input current) to be fed from the AC power supply to the PWM converter by PWM control is limited to power capable of being supplied by the AC power supply.

According to expression 2, making a difference $V_1[V]-V_2[V]$ large between the DC voltages in the DC link before and after the supply of the driving power for the motor from the power storage device can reduce the capacitance $C[F]$ of the capacitor as the power storage device. However, the DC voltage $V_1[V]$ in the DC link before the supply of the driving power for the motor from the power storage device needs to be set to a value smaller than the withstand voltages of the diodes in the PWM converter and the power storage device, and therefore has an upper limit. In addition, the DC voltage $V_2[V]$ in the DC link after the supply of the driving power for the motor from the power storage device needs to be set to a value larger than the input voltage peak value on the AC power supply side, and therefore depends on the AC power supply to be connected to the motor driving device. For example, in the case where the AC power supply is of high voltage, the DC voltage $V_2[V]$ in the DC link after the supply of the driving power for the motor from the power storage device may not be made low, and therefore the difference $V_1[V]-V_2[V]$ between the DC voltages in the DC link before and after the supply of the driving power for the motor from the power storage device may not be made large. Accordingly, it is necessary to make the capacitance $C[F]$ of the capacitor as the power storage device large in order to sufficiently ensure energy $E[J]$ to be supplied as the driving power for the motor from the power storage device, resulting in a problem that the cost and installation area of the power storage device would be increased.

Further, by limiting the magnitude of the input current (input power) to be fed from the AC power supply to the PWM converter by PWM control and by using energy stored in the power storage device for the shortage of power for motor driving, the capacity of the PWM converter can be made small, and therefore it is possible to make a selection of a PWM converter having a capacity smaller than the motor output. However, when the motor output is larger than is assumed due to some cause or when the capacitance of the capacitor as the power storage device decreases due to aged deterioration, the situation may also be considered to occur that the DC voltage (power storage device voltage) in the DC capacitor is equal to or lower than the input voltage peak value of the AC power supply because of using the energy stored in the power storage device for motor acceleration and, as a result, a motor load would be directly applied to the PWM converter. In this case, if the selected PWM converter has a small capacity with respect to the motor output, it may be impossible to limit the input current (input power) to be fed from the AC power supply to the PWM converter, and therefore, there would arise a problem that breakage of the diodes in the PWM converter or the power storage device may occur due to overcurrents, or in order to avoid this, the motor driving device itself may be stopped by alarm.

SUMMARY OF INVENTION

In view of the above problems, an object of the present invention is to provide a motor driving device that converts by a PWM converter AC power supplied from the AC power supply side to DC power and outputs the DC power to a DC link where the power storage unit is provided, and thereafter, further converts the DC power to AC power for motor driving and supplies the AC power to a motor, wherein a capacity of the PWM converter and a capacity of the power storage unit are reduced, and elements each constituting the PWM converter and the power storage unit are surely protected from overcurrents.

To achieve the above object, a motor driving device includes, a PWM converter that performs power conversion between AC power on an AC power supply side and DC power in a DC link by PWM control, an inverter that converts, during powering operation, the DC power in the DC link to AC power for motor driving and supplies the AC power to a motor, and that converts, during regenerative operation, the AC power regenerated in the motor to DC power and returns the DC power to the DC link, a power storage unit that is provided in the DC link and may store DC power, a switch that connects or disconnects between an AC power supply and the PWM converter in response to a received command, and a command unit that continues outputting a connection command to the switch while a DC voltage in the DC link is boosted up to a prescribed voltage resulting from the DC power being stored in the power storage unit, the DC power having been obtained from the AC power converted by the PWM converter in a manner such that an AC current to be fed from the AC power supply does not exceed a preset input current limit value, and that initiates outputting a disconnection command to the switch after the DC voltage in the DC link reaches the prescribed voltage and before the inverter initiates powering operation.

When the DC voltage in the DC link drops and the output of the inverter decreases from a peak value after the command unit initiates outputting the disconnection command to the switch, the command unit may be adapted to end outputting the disconnection command to the switch and start outputting the connection command to the switch.

In addition, the power storage unit may be a capacitor.

In addition, the power storage unit may include, a flywheel that may store rotational energy, a flywheel motor having a rotational shaft to which the flywheel is coupled, a flywheel inverter that performs power conversion between DC power in the DC link and AC power on the flywheel motor side, and a flywheel control unit that controls power conversion operation of the flywheel inverter.

In addition, the flywheel control unit may be adapted to control, after the DC voltage in the DC link is boosted up to the prescribed voltage, in a manner such that the flywheel inverter outputs AC power for driving the flywheel motor so as to rotate the flywheel at a prescribed rotational speed; and to control, after the command unit initiates outputting the disconnection command to the switch, power conversion operation of the flywheel inverter until the rotational energy of the flywheel is eliminated in a manner such that the DC voltage in the DC link is equal to or more than a voltage necessary for enabling power conversion by the inverter from DC power to AC power but not more than the prescribed voltage.

In addition, the flywheel control unit may be adapted to control, after the DC voltage in the DC link is boosted up to the prescribed voltage, in a manner such that the flywheel inverter outputs AC power for driving the flywheel motor so as to rotate the flywheel at the prescribed rotational speed; and to control, after the command unit initiates outputting the disconnection command to the switch, in a manner such that the flywheel inverter converts AC power equivalent to the AC power necessary for driving the motor to DC power until the rotational energy of the flywheel is eliminated.

BRIEF DESCRIPTION OF THE DRAWINGS

The present invention will be more clearly understood by referring to the following accompanying drawings.

DETAILED DESCRIPTION

A motor driving device having a PWM converter will be described below with reference to the drawings. However, it should be understood that the present invention is not to be limited to the drawings or the embodiments described below.

Figure 1:
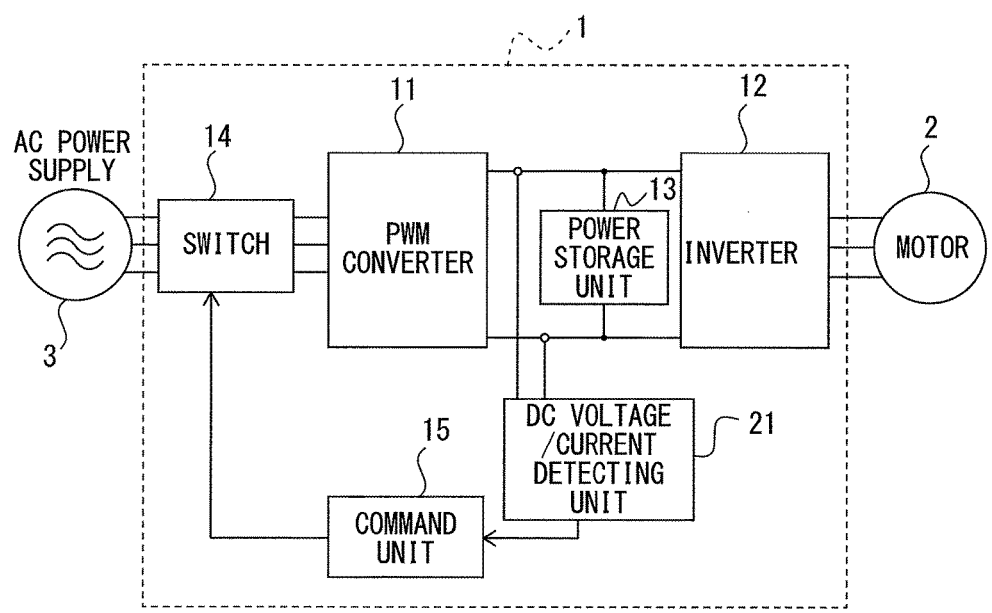
FIG. 1 is a principle block diagram of a motor driving device according to the present invention.

FIG. 1 is a principle block diagram of a motor driving device according to the present invention. In the following, it is assumed that the components to which the same reference symbols are attached in different drawings mean those having the same functions. Incidentally, although a motor driving device 1 that drive-controls a single motor 2 is described herein, the number of the motors 2 that are drive-controlled by the motor driving device 1 is not limited in the present invention but may be plural. Further, the type of the motor 2 driven by the motor driving device 1 is not limited in the present invention but may be, for example, an induction motor or a synchronous motor. Further, the phase number is not limited in the present invention but may be three phases, as well as a single phase or other multiple phases, for example.

The motor driving device 1 includes a PWM converter 11, an inverter 12 a power storage unit 13, a switch 14, and a command unit 15. An AC power supply 3 is connected to the motor driving device 1 on the three-phase AC input side, and the three-phase motor 2 is connected to the motor driving device 1 on the AC motor side. Note that, in FIG. 1, a control system for driving the motor 2 and a charging unit for use in boosting a DC link voltage from 0[V] to an input voltage peak value are not illustrated for ease of description. Further, the motor driving device 1 includes a DC voltage/current detecting unit 21 for detecting a DC voltage and a DC current in a DC link, which is the DC side of the PWM converter 11, the DC voltage/current detecting unit 21 being generally provided in order to detect the current and the voltage necessary for drive-controlling the motor 2.

The PWM converter 11 is constituted of a bridge circuit having semiconductor switching elements and diodes connected in reverse parallel therewith, and with switching operations of the semiconductor switching elements being PWM-controlled based on motor drive commands received from a host controller (not illustrated in FIG. 1), performs power conversion between AC power on the AC power supply 3 side and DC power in the DC link in a manner such that a power supply current (AC current) to be fed from the AC power supply 3 does not exceed a preset input current limit value. Examples of the semiconductor switching elements include an IGBT, a thyristor, a GTO (Gate Turn-OFF thyristor), a transistor and the like, but the type itself of the semiconductor switching elements is not limited in the present invention but other types of semiconductor switching elements may be employed. Further, the charging unit, which is not illustrated in FIG. 1, is a combination of a resistor and a short-circuiting element that short-circuits the resistor, and is generally provided within the PWM converter 11. A thermistor may be used instead of the resistor, and a switch or a semiconductor switching element is used for the short-circuiting element.

The inverter 12 is connected to the PWM converter 11 via the DC link. The inverter 12 converts, during powering operation, the DC power in the DC link to AC power for motor driving and supplies the AC power to the motor 2, and converts, during regenerative operation, the AC power regenerated in the motor 2 to DC power and returns the DC power to the DC link. The inverter 12 is constituted of a bridge circuit having semiconductor switching elements and diodes connected in reverse parallel therewith, such as a PWM inverter, for example. Examples of the semiconductor switching elements include an IGBT, a thyristor, a GTO (Gate Turn-OFF thyristor), a transistor and the like, but the type itself of the semiconductor switching elements is not limited in the present invention but other types of semiconductor switching elements may be employed. The inverter 12 causes the switching elements therein to perform switching operations based on motor drive commands received from the host controller (not illustrated in FIG. 1) to convert the DC power supplied from the DC link side to three-phase AC power at a desired voltage and a desired frequency for driving the motor 2. The motor 2 results in operating based on the supplied three-phase AC power having a variable voltage and a variable frequency. Further, regenerative power is generated during deceleration of the motor 2, and the AC regenerative power generated in the motor 2 is converted to DC power and returned to the DC link based on the motor drive commands received from the host controller.

The power storage unit 13 is provided in the DC link and may store DC power. Examples of the power storage unit include a capacitor and a flywheel, but the details thereof will be described later.

The switch 14 connects or disconnects between the AC power supply 3 and the PWM converter 11 in response to a received command. Examples of the switch 14 include a relay, a power semiconductor switching element, and the like.

The command unit 15 continues outputting a connection command to the switch 14 while the DC voltage in the DC link, which has been detected by the DC voltage/current detecting unit 21, is boosted up to a prescribed voltage $V_1$ resulting from the DC power being stored in the power storage unit 13, the DC power having been obtained from the AC power converted by the PWM converter 11 in a manner such that an AC current to be fed from the AC power supply 3 does not exceed the preset input current limit value. Then, the command unit 15 initiates outputting a disconnection command to the switch 14 after the DC voltage in the DC link, which has been detected by the DC voltage/current detecting unit 21, reaches the prescribed voltage $V_1$ and before the inverter 12 initiates powering operation. Further, when the DC voltage in the DC link drops and output from the inverter 12 decreases from a peak value after initiation of outputting the disconnection command to the switch 14, the command unit 15 ends outputting the disconnection command to the switch 14 to initiate outputting the connection command to the switch 14, thereby performing charging to the input voltage peak value. More specifically, after initiation of outputting the disconnection command to the switch 14, the command unit 15 ends outputting the disconnection command to the switch 14 to initiate outputting the connection command to the switch 14 before the output from the motor 2 decreases and the DC voltage in the DC link drops to be less than a voltage $V_2$ necessary for enabling power conversion from DC power to AC power by the inverter 12 thereby performing charging to the input voltage peak value. Alternatively, the command unit 15 may end outputting the disconnection command to the switch 14 to initiate outputting the connection command to the switch 14 after the DC voltage in the DC link drops to be less than the voltage $V_2$ necessary for enabling power conversion from DC power to AC power by the inverter 12 thereby performing charging to the input voltage peak value. The charging to the input voltage peak value is performed by operating the PWM converter 11 as a normal diode rectifier without PWM control, with use of current equal to or less than the input current limit value so as to avoid breakage of the PWM converter 11, the power storage unit 13, and the switch 14.

Figure 2A:
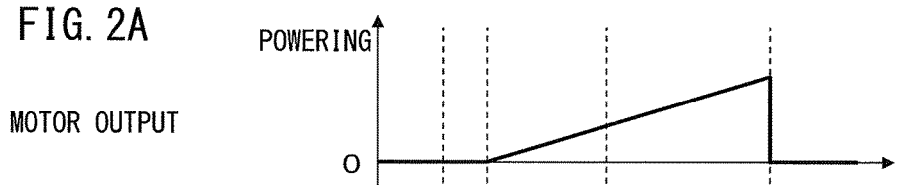
FIG. 2A is a diagram illustrating operation of the motor driving device according to the present invention, the diagram indicating a motor output.
Figure 2B:
FIG. 2B is a diagram illustrating operation of the motor driving device according to the present invention, the diagram indicating a power supply current to be fed from an AC power supply to a PWM converter.
Figure 2C:
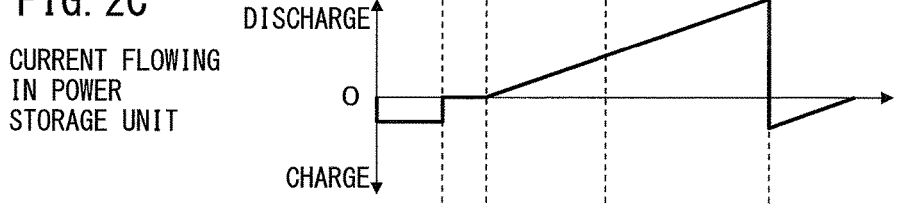
FIG. 2C is a diagram illustrating operation of the motor driving device according to the present invention, the diagram indicating current flow in a power storage device (power storage unit)
Figure 2D:
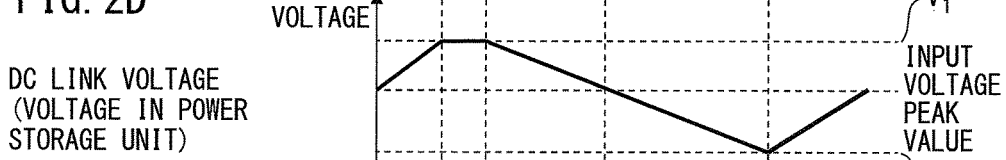
FIG. 2D is a diagram illustrating operation of the motor driving device according to the present invention, the diagram indicating a DC link voltage.
Figure 2E:
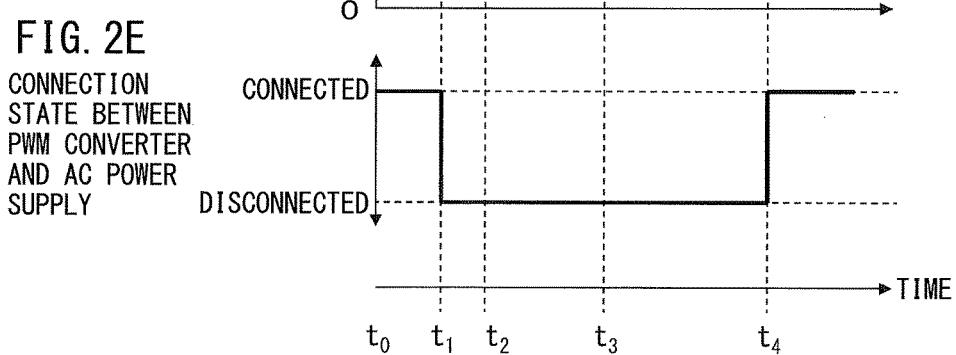
FIG. 2E is a diagram illustrating operation of the motor driving device according to the present invention, the diagram indicating connection relation between the AC power supply and the PWM converter.

FIGS. 2A to 2E are diagrams illustrating operation of the motor driving device according to the present invention, FIG. 2A illustrating a motor output, FIG. 2B illustrating a power supply current to be fed from an AC power supply to a PWM converter, FIG. 2C illustrating current flow in a power storage device (power storage unit), FIG. 2D illustrating a DC link voltage, and FIG. 2E illustrating connection relation between the AC power supply and the PWM converter.

Firstly, a case in which a DC voltage in a DC link has already been boosted up to the input voltage peak value of the AC power supply 3 (i.e. the power storage unit 13 has already been charged to the input voltage peak value of the AC power supply 3) at time $t_0$ as illustrated in FIG. 2D and the AC power supply 3 and the PWM converter 11 are connected as illustrated in FIG. 2E is considered.

During a period between time $t_0$ and time $t_1$ at which the DC voltage in the DC link reaches the preset prescribed voltage $V_1$ at time $t_1$, the command unit 15 continues outputting the connection command to the switch 14. Thus, the connection between the AC power supply 3 and the PWM converter 11 by the switch 14 is maintained (FIG. 2E), and therefore a power supply current (AC current) flows from the AC power supply 3 into the PWM converter 11 (FIG. 2B). The PWM converter 11 converts AC power on the AC power supply 3 side to DC power, while being PWM-controlled in a manner such that the power supply current (AC current) to be fed from the AC power supply 3 does not exceed the preset input current limit value (FIG. 2B). The power storage unit 13 is charged with the DC power output from the PWM converter 11 (FIG. 2C), and the DC voltage in the DC link (i.e. the DC voltage applied to the power storage unit 13) gradually increases (FIG. 2D).

After the DC voltage in the DC link has reached the prescribed voltage $V_1$ at time $t_1$, the command unit 15 initiates outputting the disconnection command to the switch 14 before time $t_2$ at which the inverter 12 initiates powering operation (i.e. before acceleration of the motor 2 is started). Thus, disconnection operation between the AC power supply 3 and the PWM converter 11 by the switch 14 has been completed during a period between time $t_1$ and time $t_2$ at which acceleration of the motor 2 is started and the disconnected state between the AC power supply 3 and the PWM converter 11 is maintained after time $t_1$ (FIG. 2E). As a result, the power supply current (AC current) from the AC power supply 3 does not flow into the PWM converter 11 (FIG. 2B), no current flows in the power storage unit 13 (FIG. 2C), and the DC voltage in the DC link is maintained at the prescribed voltage $V_1$ (FIG. 2D).

Even when the inverter 12 initiates powering operation and acceleration of the motor 2 is started at time $t_2$ (FIG. 2A), since the AC power supply 3 and the PWM converter 11 are disconnected, the power supply current (AC current) from the AC power supply 3 does not flow into the PWM converter 11 (FIG. 2B). The inverter 12 converts the DC power discharged from the power storage unit 13 to AC power and supplies the AC power to the motor 2 in response to increase in the output of the motor 2 (FIG. 2A), resulting in that the motor 2 is driven by the energy stored in the power storage unit 13. Consequently, the DC current discharged from the power storage unit 13 flows into the inverter 12 (FIG. 2C), and the DC voltage in the DC link gradually decreases (FIG. 2D).

Further, after initiation of outputting the disconnection command to the switch 14, the command unit 15 ends outputting the disconnection command to the switch 14 to initiate outputting the connection command to the switch 14 before time $t_4$ at which the DC voltage in the DC link drops to be less than the voltage $V_2$ necessary for enabling power conversion from DC power to AC power by the inverter 12. Thus, the AC power supply 3 and the PWM converter 11 are connected by the switch 14 (FIG. 2E), and therefore the power supply current (AC current) flows from the AC power supply 3 into the PWM converter 11 (FIG. 2B). Until the DC link voltage reaches the input voltage peak value, the PWM converter 11 converts the AC power on the AC power supply 3 side to DC power by operating as a normal diode rectifier without PWM control and limiting current (FIG. 2B) in a manner such that the power supply current (AC current) to be fed from the AC power supply 3 does not exceed the preset input current limit value. The power storage unit 13 is charged with the DC power output from the PWM converter 11 (FIG. 2C), and the DC voltage in the DC link (i.e. the DC voltage applied to the power storage unit 13) gradually increases, thus returning to the same state at time $t_0$ (FIG. 2D).

In this way, in the motor driving device of the present invention, even when the DC voltage in the DC link decreases and falls below the input voltage peak value at time $t_3$ (FIG. 2D) and acceleration of the motor 2 is further continued (FIG. 2A), the disconnected state between the AC power supply 3 and the PWM converter 11 is maintained (FIG. 2E) and therefore the power supply current does not flow into the PWM converter 11 (FIG. 2B). In other words, even when the DC voltage in the DC link is equal to or less than the input voltage peak value, there is no current flowing into the diodes in the PWM converter 11 as has conventionally been the case, and therefore breakage of the diodes in the PWM converter 11 or the power storage unit 13 due to overcurrents may not occur and the motor driving device 1 itself may not be stopped by alarm. Therefore, according to the motor driving device 1, it is possible to drive the motor 2 without being affected by the input voltage peak value and to make a selection of the small-capacity PWM converter 11. In addition, it is possible to drive the motor 2 by the energy stored in the power storage unit 13 until time $t_4$ at which the DC voltage in the DC link falls below the input voltage peak value to be the voltage $V_2$ necessary for enabling power conversion from DC power to AC power by the inverter 12 (i.e., the minimum voltage necessary for driving the motor 2) (FIG. 2D). According to the motor driving device 1, since it is possible to set the minimum voltage $V_2$ necessary for driving the motor 2 to a value smaller than the input voltage peak value, a difference between the DC voltages in the DC link before and after the supply of the driving power for the motor from the power storage device, i.e., $V_1-V_2$ in expression 2 described above, can be made larger than is conventional. As a result, if a capacitor is employed as the power storage unit 13, for example, it is possible to reduce the capacitance C compared with the conventional case.

As has been described above, in the motor driving device 1, during a period in which the DC voltage in the DC link is boosted up to the prescribed voltage, the AC power supply 3 and the PWM converter 11 are connected. After the DC voltage in the DC link reaches the prescribed voltage $V_1$, the disconnection operation between the AC power supply 3 and the PWM converter 11 is completed before the inverter 12 initiates powering operation (i.e. before acceleration of the motor 2 is started). Further, after initiation of outputting the disconnection command to the switch 14, the connection operation between the AC power supply 3 and the PWM converter 11 is completed before the DC voltage in the DC link is less than the voltage $V_2$ necessary for enabling power conversion from DC power to AC power by the inverter 12. Note that in the case where there may be some time during which no power conversion from DC power to AC power by the inverter 12 is possible, the connection operation between the AC power supply 3 and the PWM converter 11 may be completed after the DC voltage is less than the voltage $V_2$.

Next, a more specific configuration of the motor driving device 1 described with reference to FIG. 1 will be described using first and second examples in which a capacitor is employed as the power storage unit 13.

Figure 3:
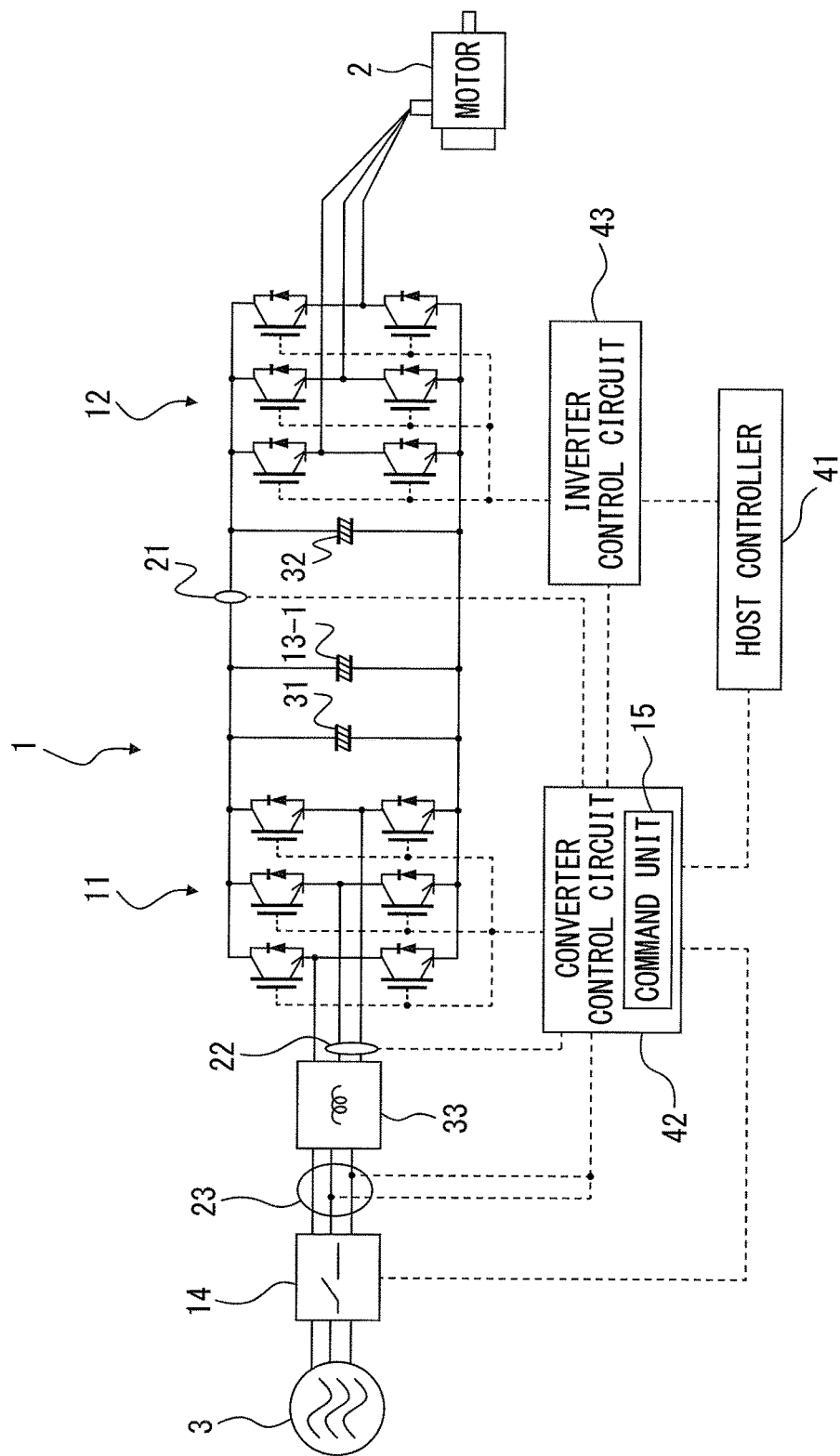
FIG. 3 is a circuit diagram illustrating a motor driving device according to first and second examples.

FIG. 3 is a circuit diagram illustrating a motor driving device according to the first and second examples. Incidentally, although a motor driving device 1 that drive-controls a single motor 2 is described herein, the number of the motors 2 that are drive-controlled by the motor driving device 1 is not limited in the present invention but may be plural. Further, the type of the motor 2 driven by the motor driving device 1 is not limited in the present invention but may be, for example, an induction motor or a synchronous motor. Further, the phase number is not limited in the present invention but may be three phases, as well as a single phase or other multiple phases, for example.

In the first and second examples, the motor driving device 1 includes a PWM converter 11, an inverter 12 a capacitor 13-1 as a power storage unit, a switch 14, and a command unit 15. The PWM converter 11, the inverter 12, the switch 14 and the command unit 15 are as described with reference to FIG. 1 and FIGS. 2A to 2E. In the first and second examples, the power storage unit is represented by the capacitor 13-1, and smoothing capacitors provided respectively on the DC output side of the PWM converter 11 and on the DC input side of the inverter 12 are denoted by reference symbols 31 and 32.

The motor driving device 1 includes, as a control system thereof, a host controller 41, a converter control circuit 42, and an inverter control circuit 43. In addition, the motor driving device 1 includes, as a detection system thereof, a DC voltage/current detecting unit 21, an AC current detecting unit 22, and an AC voltage detecting unit 23.

Based on a command from the host controller 41, a DC voltage in a DC link detected by the DC voltage/current detecting unit 21, an AC current flowing into the PWM converter 11 detected by the AC current detecting unit 22, and an AC voltage in the AC power supply 3 detected by the AC voltage detecting unit 23, the converter control circuit 42 PWM-controls switching operations of semiconductor switching elements in the PWM converter 11 so that the PWM converter 11 performs power conversion between AC power on the AC power supply 3 side and DC power in the DC link in a manner such that a power supply current (AC current) to be fed from the AC power supply 3 does not exceed a preset input current limit value.

The inverter control circuit 43 PWM-controls switching operations of semiconductor switching elements in the inverter 12 based on a command from the host controller 41.

The host controller 41 integrally controls the converter control circuit 42 and the inverter control circuit 43. Although not illustrated herein, the host controller 41 uses a predetermined operation program for the motor 2, an AC current or AC voltage on the AC output side of the inverter 12 and/or a rotational speed of the motor 2 to output drive commands for controlling the speed and torque of the motor 2, or the position of a rotor to the inverter control circuit 43.

In the first and second examples, the command unit 15, which has been described with reference to FIG. 1 and FIGS. 2A to 2E, is provided in the converter control circuit 42.

Figure 4:
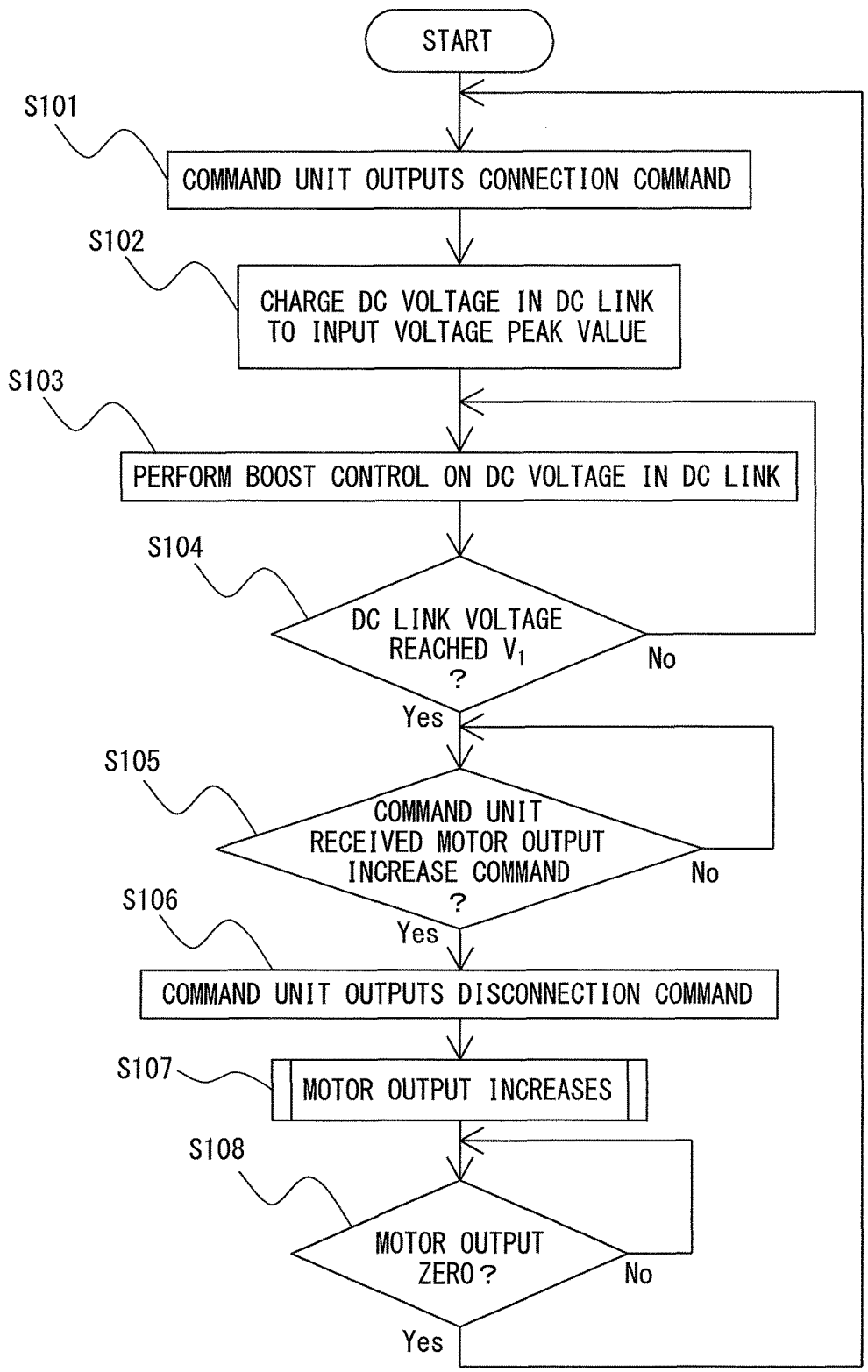
FIG. 4 is a flow chart illustrating operational flow of the motor driving device according to the first example.

FIG. 4 is a flow chart illustrating operational flow of the motor driving device according to the first example.

In activation of the motor driving device 1, firstly at step S101, the command unit 15 outputs a connection command to the switch 14. Outputting of the connection command by the command unit 15 at the time of activation of the motor driving device 1 is executed in response to receiving a notification of activation of the motor driving device 1 from the host controller 41. Upon reception of the connection command from the command unit 15, the switch 14 establishes the connection between the AC power supply 3 and the PWM converter 11. Since being not PWM-controlled at this time point, the PWM converter 11 operates merely as a diode rectifier and diode-rectifies the AC current flowing thereinto from the AC power supply 3 to output a DC current to the DC link. Thereby, the capacitor 13-1 starts to be charged.

The DC voltage in the DC link (i.e. the DC voltage applied to the capacitor 13-1) gradually increases, and when charged to the input voltage peak value (step S102), the converter control circuit 42 initiates PWM control on the PWM converter 11 in order to control the boosting of the DC voltage in the DC link at step S103. The PWM converter 11 converts AC power on the AC power supply 3 side to DC power in the DC link, by being PWM-controlled in a manner such that the power supply current (AC current) to be fed from the AC power supply 3 does not exceed the input current limit value, and the DC voltage in the DC link is further boosted up to a voltage equal to or more than the input voltage peak value.

At step S104, the converter control circuit 42 determines whether or not the DC voltage in the DC link detected by the DC voltage/current detecting unit 21 has reached the prescribed voltage $V_1$ prescribed in advance. If the DC voltage in the DC link has reached the prescribed voltage $V_1$, processing proceeds to step S105.

At step S105, the command unit 15 determines whether or not the converter control circuit 42 has received a motor output increase command from the host controller 41. If the converter control circuit 42 has received the motor output increase command, processing proceeds to step S106. Note that the host controller 41 outputs the motor output increase command to both the converter control circuit 42 and the inverter control circuit 43 in a manner such that outputting to the converter control circuit 42 is performed prior to outputting to inverter control circuit 43, rather than simultaneously outputting the motor output increase commands.

At step S106, the command unit 15 outputs a disconnection command to the switch 14. Upon reception of the disconnection command from the command unit 15, the switch 14 disconnects between the AC power supply 3 and the PWM converter 11. As a result, the power supply current (AC current) from the AC power supply 3 does not flow into the PWM converter 11.

Thereafter, at step S107, the inverter control circuit 43 initiates powering operation of the inverter 12 by PWM control, and in response to increase in the output of the motor 2, the DC power discharged from the capacitor 13-1 is converted to AC power for supplying to the motor 2, resulting in that the motor 2 is driven by the energy stored in the capacitor 13-1. Since the AC power supply 3 and the PWM converter 11 are disconnected at this time, the power supply current (AC current) from the AC power supply 3 does not flow into the PWM converter 11 and the DC voltage in the DC link gradually decreases, as has been described above.

Next, at step S108, the command unit 15 determines whether or not the motor output is zero based on a signal from the host controller 41. If the motor output is zero, processing returns to step S101, and the command unit 15 outputs a connection command to the switch 14. Upon reception of the connection command from the command unit 15, the switch 14 establishes the connection between the AC power supply 3 and the PWM converter 11. Hereinafter the processing in each step described above is repeated. Incidentally, if it is determined that the motor output is zero at step S108, the command unit 15 outputs the connection command to the switch 14 for re-connecting between the AC power supply 3 and the PWM converter 11 at step S101, but the re-connection may be performed as a modification when the motor output is other than zero if the switch 14 is durable against inrush current that may flow at the time of the re-connection.

Figure 5:
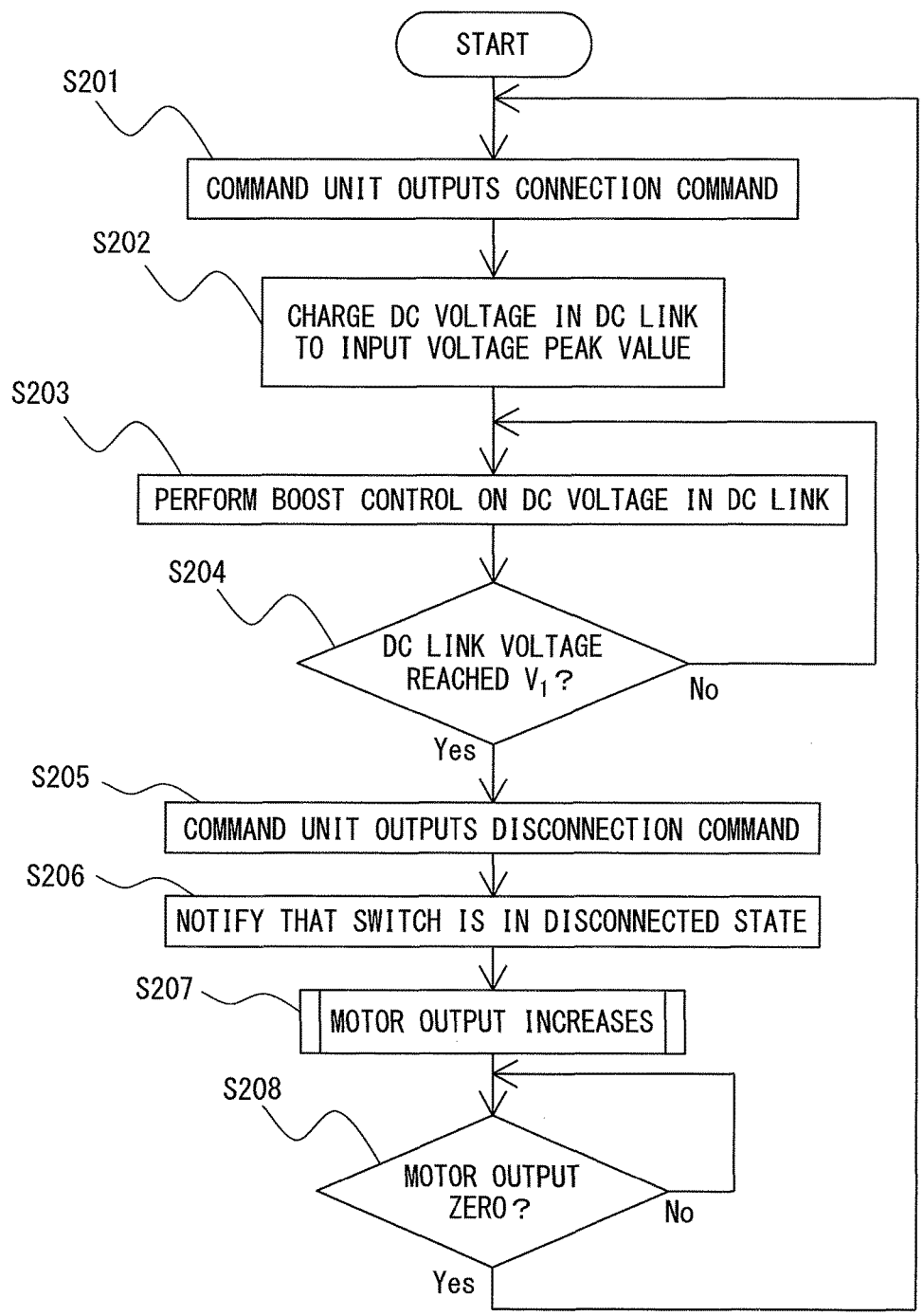
FIG. 5 is a flow chart illustrating operational flow of the motor driving device according to the second example.

FIG. 5 is a flow chart illustrating operational flow of the motor driving device according to the second example.

In activation of the motor driving device 1, firstly at step S201, the command unit 15 outputs a connection command to the switch 14. As is the same in the case of the first example, outputting of the connection command by the command unit 15 at the time of activation of the motor driving device 1 is executed in response to receiving a notification of activation of the motor driving device 1 from the host controller 41. Upon reception of the connection command from the command unit 15, the switch 14 establishes the connection between the AC power supply 3 and the PWM converter 11. Since being not PWM-controlled at this time point, the PWM converter 11 operates merely as a diode rectifier and diode-rectifies the AC current flowing thereinto from the AC power supply 3 to output a DC current to the DC link. Thereby, the capacitor 13-1 starts to be charged.

The DC voltage in the DC link (i.e., the DC voltage applied to the capacitor 13-1) gradually increases, and when charged to the input voltage peak value (step S202), the converter control circuit 42 initiates PWM control on the PWM converter 11 in order to control the boosting of the DC voltage in the DC link at step S203. The PWM converter 11 converts AC power on the AC power supply 3 side to DC power in the DC link, by being PWM-controlled in a manner such that the power supply current (AC current) to be fed from the AC power supply 3 does not exceed the input current limit value, and the DC voltage in the DC link is further boosted up to a voltage equal to or more than the input voltage peak value.

At step S204, the converter control circuit 42 determines whether or not the DC voltage in the DC link detected by the DC voltage/current detecting unit 21 has reached the prescribed voltage $V_1$ prescribed in advance. If the DC voltage in the DC link has reached the prescribed voltage $V_1$, processing proceeds to step S205.

At step S205, the command unit 15 outputs a disconnection command to the switch 14. Upon reception of the disconnection command from the command unit 15, the switch 14 disconnects between the AC power supply 3 and the PWM converter 11. As a result, the power supply current (AC current) from the AC power supply 3 does not flow into the PWM converter 11.

Next, at step S206, the command unit 15 notifies the host controller 41 that the switch 14 is in a disconnected state.

Upon reception of the notification that the switch 14 is in the disconnected state, the host controller 41 outputs a motor output increase command to the inverter control circuit 43. As a result, the inverter control circuit 43 initiates powering operation of the inverter 12 by PWM control and the DC power discharged from the power storage unit 13 is converted to AC power for supplying to the motor 2, resulting in that the motor 2 is driven by the energy stored in the capacitor 13-1 and the output of the motor 2 increases (step S207). Since the AC power supply 3 and the PWM converter 11 are disconnected at this time, the power supply current (AC current) from the AC power supply 3 does not flow into the PWM converter 11 and the DC voltage in the DC link gradually decreases, as has been described above.

Next, at step S208, the command unit 15 determines whether or not the motor output is zero based on a signal from the host controller 41. If the motor output is zero, processing returns to step S201, and the command unit 15 outputs a connection command to the switch 14. Upon reception of the connection command from the command unit 15, the switch 14 establishes the connection between the AC power supply 3 and the PWM converter 11. Hereinafter the processing in each step described above is repeated. Incidentally, if it is determined that the motor output is zero at step S208, the command unit 15 outputs the connection command to the switch 14 for re-connecting between the AC power supply 3 and the PWM converter 11 at step S201, but the re-connection may be performed as a modification when the motor output is other than zero if the switch 14 is durable against inrush current that may flow at the time of the re-connection.

Next, a more specific configuration of the motor driving device 1 described with reference to FIG. 1 will be described using third and fourth examples in which a flywheel power storage device is employed as the power storage unit 13.

Figure 6:
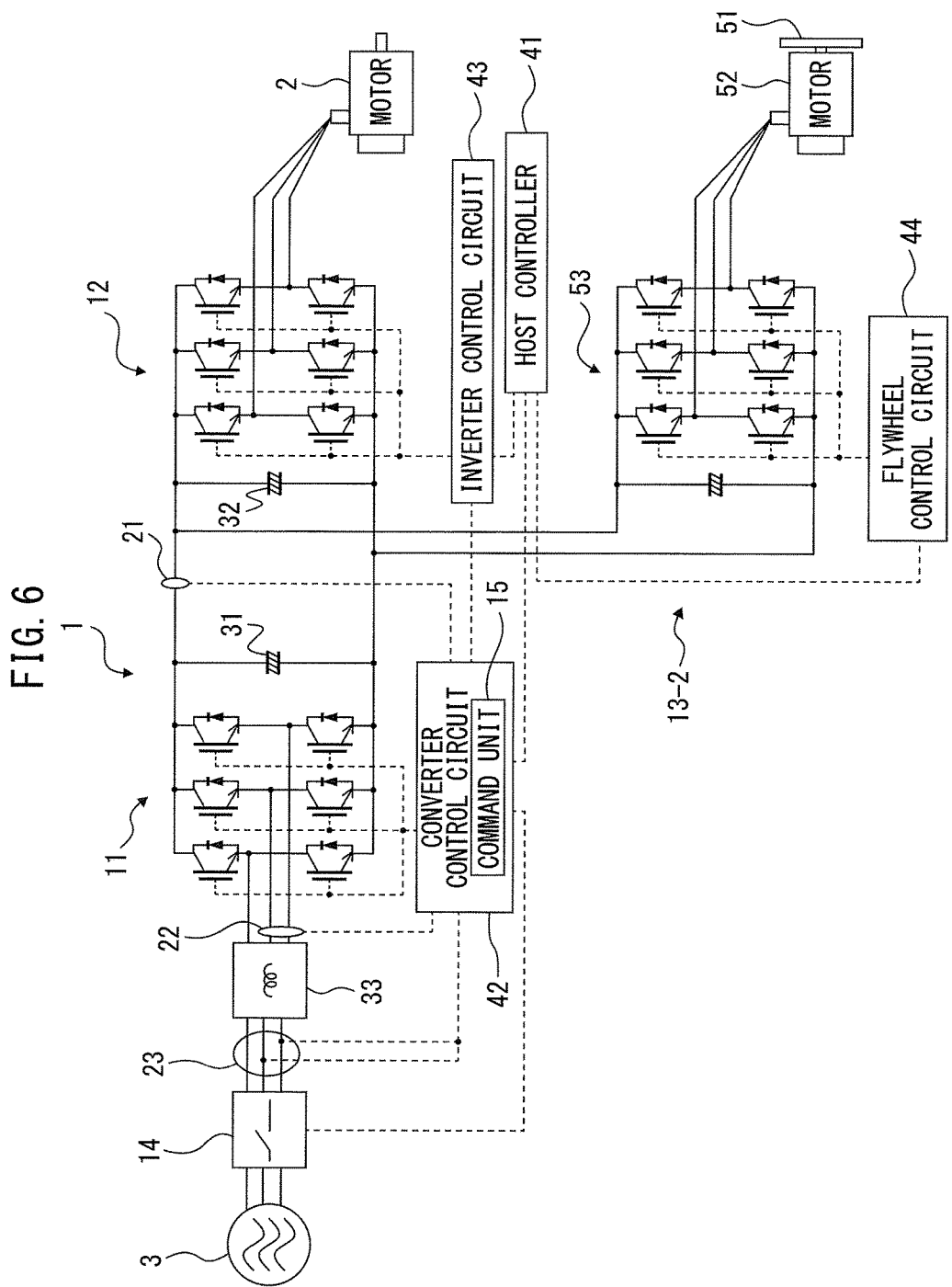
FIG. 6 is a circuit diagram illustrating a motor driving device according to third and fourth examples.

FIG. 6 is a circuit diagram illustrating a motor driving device according to third and fourth examples. Incidentally, although a motor driving device 1 that drive-controls a single motor 2 is described herein, the number of the motors 2 that are drive-controlled by the motor driving device 1 is not limited in the present invention but may be plural. Further, the type of the motor 2 driven by the motor driving device 1 is not limited in the present invention but may be, for example, an induction motor or a synchronous motor. Further, the phase number is not limited in the present invention but may be three phases, as well as a single phase or other multiple phases, for example.

In the third and fourth examples, the motor driving device 1 includes a PWM converter 11, an inverter 12 a flywheel power storage device 13-2 as a power storage unit, a switch 14, and a command unit 15. The PWM converter 11, the inverter 12 the switch 14 and the command unit 15 are as described with reference to FIG. 1 and FIGS. 2A to 2E. In the third and fourth examples, the power storage unit is represented by the flywheel power storage device 13-2. Smoothing capacitors 31 and 32 are provided respectively on the DC output side of the PWM converter 11 and on the DC input side of the inverter 12.

The motor driving device 1 includes, as a control system thereof, a host controller 41, a converter control circuit 42, an inverter control circuit 43, and a flywheel control circuit 44. In addition, the motor driving device 1 includes, as a detection system thereof, a DC voltage/current detecting unit 21, an AC current detecting unit 22, and an AC voltage detecting unit 23. The converter control circuit 42, the inverter control circuit 43, the DC voltage/current detecting unit 21, the AC current detecting unit 22, and the AC voltage detecting unit 23 are as described with reference to FIGS. 1 to 5. The DC voltage/current detecting unit 21 may be provided in the inverter control circuit 43 to notify the detection results thereof to the host controller 41, the converter control circuit 42, and the flywheel control circuit 44, or alternatively, may be provided in the flywheel control circuit 44 to notify the detection results thereof to the host controller 41, the converter control circuit 42, and the inverter control circuit 43.

The host controller 41 integrally controls the converter control circuit 42, the inverter control circuit 43, and the flywheel control circuit 44. Although not illustrated herein, the host controller 41 uses a predetermined operation program for the motor 2, an AC current or AC voltage on the AC output side of the inverter 12 and/or a rotational speed of the motor 2 to output drive commands for controlling the speed and torque of the motor 2, or the position of a rotor to the inverter control circuit 43.

In the third and fourth examples, the command unit 15, which has been described with reference to FIG. 1 and FIGS. 2A to 2E, is provided in the converter control circuit 42, as is the same in the case of the first and second examples.

The flywheel power storage device 13-2 as the power storage unit includes a flywheel 51 that may store rotational energy, a flywheel motor 52 having a rotational shaft to which the flywheel 51 is coupled, a flywheel inverter 53 that performs power conversion between DC power in the DC link and AC power on the flywheel motor 52 side, and a flywheel control circuit 44 as a flywheel control unit that controls power conversion operation of the flywheel inverter 53.

Among the above, the flywheel inverter 53 is constituted of a bridge circuit having semiconductor switching elements and diodes connected in reverse parallel therewith, such as a PWM inverter, for example. Examples of the semiconductor switching elements include an IGBT, a thyristor, a GTO (Gate Turn-OFF thyristor), a transistor and the like, but the type itself of the semiconductor switching elements is not limited in the present invention but other types of semiconductor switching elements may be employed. The flywheel inverter 53 causes the switching elements therein to perform switching operations by being PWM-controlled by the flywheel control circuit 44, and performs power conversion between the DC power in the DC link and the AC power on the flywheel motor 52 side.

Figure 7:
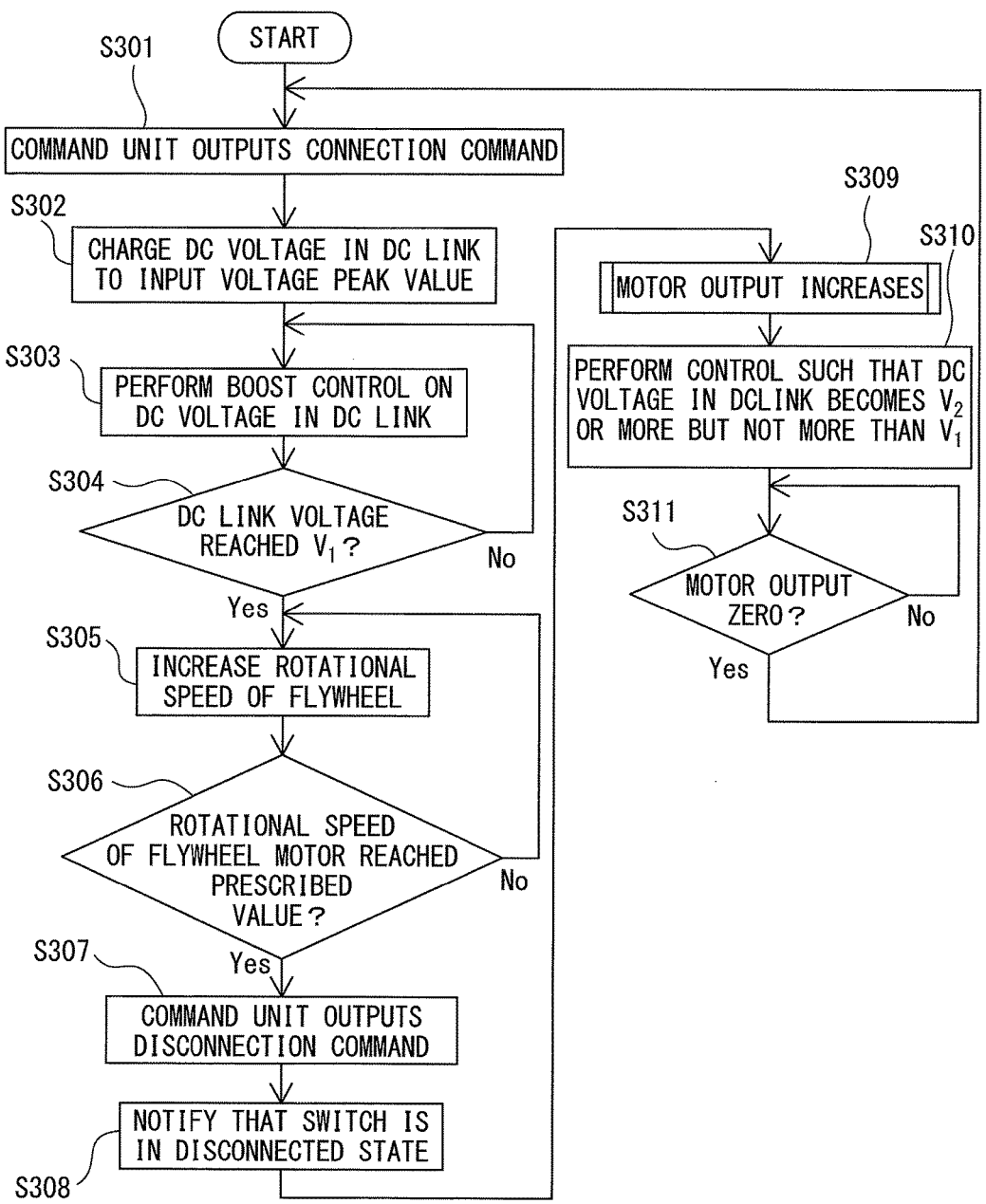
FIG. 7 is a flow chart illustrating operational flow of the motor driving device according to the third example.

FIG. 7 is a flow chart illustrating operational flow of the motor driving device according to the third example. In the third example, the flywheel control circuit 44 controls, after the DC voltage in the DC link is boosted up to the prescribed voltage $V_1$, in a manner such that the flywheel inverter 53 outputs AC power for driving the flywheel motor 52 so as to rotate the flywheel 51 at a prescribed rotational speed. The prescribed rotational speed is set to, for example, be half the maximum rotational speed of the motor 2. Then, the flywheel control circuit 44 controls, after the command unit 15 initiates outputting the disconnection command to the switch 14, power conversion operation of the flywheel inverter 53 until the rotational energy of the flywheel 51 is eliminated in a manner such that the DC voltage in the DC link is equal to or more than the voltage $V_2$ necessary for enabling power conversion by the inverter 12 from DC power to AC power but not more than the prescribed voltage $V_1$.

In activation of the motor driving device 1, firstly at step S301, the command unit 15 outputs a connection command to the switch 14. Outputting of the connection command by the command unit 15 at the time of activation of the motor driving device 1 is executed in response to receiving a notification of activation of the motor driving device 1 from the host controller 41. Upon reception of the connection command from the command unit 15, the switch 14 establishes the connection between the AC power supply 3 and the PWM converter 11. Since being not PWM-controlled at this time point, the PWM converter 11 operates merely as a diode rectifier and diode-rectifies the AC current flowing thereinto from the AC power supply 3 to output a DC current to the DC link.

The DC voltage in the DC link (i.e. the DC voltage applied to the power storage unit) gradually increases, and when charged to the input voltage peak value (step S302), the converter control circuit 42 initiates PWM control on the PWM converter 11 in order to control the boosting of the DC voltage in the DC link at step S303. The PWM converter 11 converts AC power on the AC power supply 3 side to DC power in the DC link, by being PWM-controlled in a manner such that the power supply current (AC current) to be fed from the AC power supply 3 does not exceed the input current limit value, and the DC voltage in the DC link is further boosted up to a voltage equal to or more than the input voltage peak value.

At step S304, the converter control circuit 42 determines whether or not the DC voltage in the DC link detected by the DC voltage/current detecting unit 21 has reached the prescribed voltage $V_1$ prescribed in advance. If the DC voltage in the DC link has reached the prescribed voltage $V_1$, processing proceeds to step S305.

At step S305, the flywheel control circuit 44 PWM-controls switching operations of the semiconductor switching elements in the flywheel inverter 53 so that the flywheel inverter 53 converts DC power in the DC link to AC power for driving the flywheel motor 52. Consequently, the flywheel motor 52 is driven by the AC power output from the flywheel inverter 53, resulting in the rotation of the flywheel 51 coupled to the rotational shaft of the flywheel motor 52. In other words, in the flywheel power storage device 13-2, the DC power in the DC link is converted to the rotational energy for the flywheel 51 and is stored.

Next, at step S306, the flywheel control circuit 44 determines whether or not the rotational speed of the flywheel 51 has reached the prescribed rotational speed. The rotational speed of the flywheel 51 is detected by a rotation sensor (not illustrated), and the flywheel control circuit 44 uses the rotational speed thus detected to determine whether or not the prescribed rotational speed has been reached. If the rotational speed of the flywheel 51 has reached the prescribed rotational speed, processing proceeds to step S307.

At step S307, the command unit 15 outputs a disconnection command to the switch 14. Upon reception of the disconnection command from the command unit 15, the switch 14 disconnects between the AC power supply 3 and the PWM converter 11. As a result, the power supply current (AC current) from the AC power supply 3 does not flow into the PWM converter 11.

Next, at step S308, the command unit 15 notifies the host controller 41 that the switch 14 is in a disconnected state.

Upon reception of the notification that the switch 14 is in the disconnected state, the host controller 41 outputs a motor output increase command to the inverter control circuit 43. Consequently, the inverter control circuit 43 increases the output of the inverter 12 by PWM control. At this time, in order to convert the rotational energy stored in the flywheel 51 to electric energy, the flywheel control circuit 44 controls power conversion operation of the flywheel inverter 53 in a manner such that the flywheel motor 52 coupled to the flywheel 51 is decelerated to generate a regenerative power, and the regenerated power is converted to DC power and the DC power is returned to the DC link. As a result, the DC power in the DC link obtained from the rotational energy converted in the flywheel power storage unit 13-2 is converted by the inverter 12 to AC power for supplying to the motor 2, resulting in that the motor 2 is driven by the AC power and the output of the motor 2 increases (step S309). Since the AC power supply 3 and the PWM converter 11 are disconnected at this time, the power supply current (AC current) from the AC power supply 3 does not flow into the PWM converter 11 and the DC voltage in the DC link gradually decreases, as has been described above.

At step S310, the flywheel control circuit 44 controls power conversion operation of the flywheel inverter 53 in a manner such that the DC voltage in the DC link detected by the DC voltage/current detecting unit 21 is equal to or more than the voltage $V_2$ necessary for enabling power conversion by the inverter 12 from DC power to AC power but not more than the prescribed voltage $V_1$. The control on the flywheel inverter 53 by the flywheel control circuit 44 at step S310 is executed until the rotational energy of the flywheel 51 is eliminated.

Next, at step S311, the command unit 15 determines whether or not the motor output is zero based on a signal from the host controller 41. If the motor output is zero, processing returns to step S301, and the command unit 15 outputs a connection command to the switch 14. Upon reception of the connection command from the command unit 15, the switch 14 establishes the connection between the AC power supply 3 and the PWM converter 11. Hereinafter the processing in each step described above is repeated. Incidentally, if it is determined that the motor output is zero at step S311, the command unit 15 outputs the connection command to the switch 14 for re-connecting between the AC power supply 3 and the PWM converter 11 at step S301, but the re-connection may be performed as a modification when the motor output is other than zero if the switch 14 is durable against inrush current that may flow at the time of the re-connection.

Figure 8:
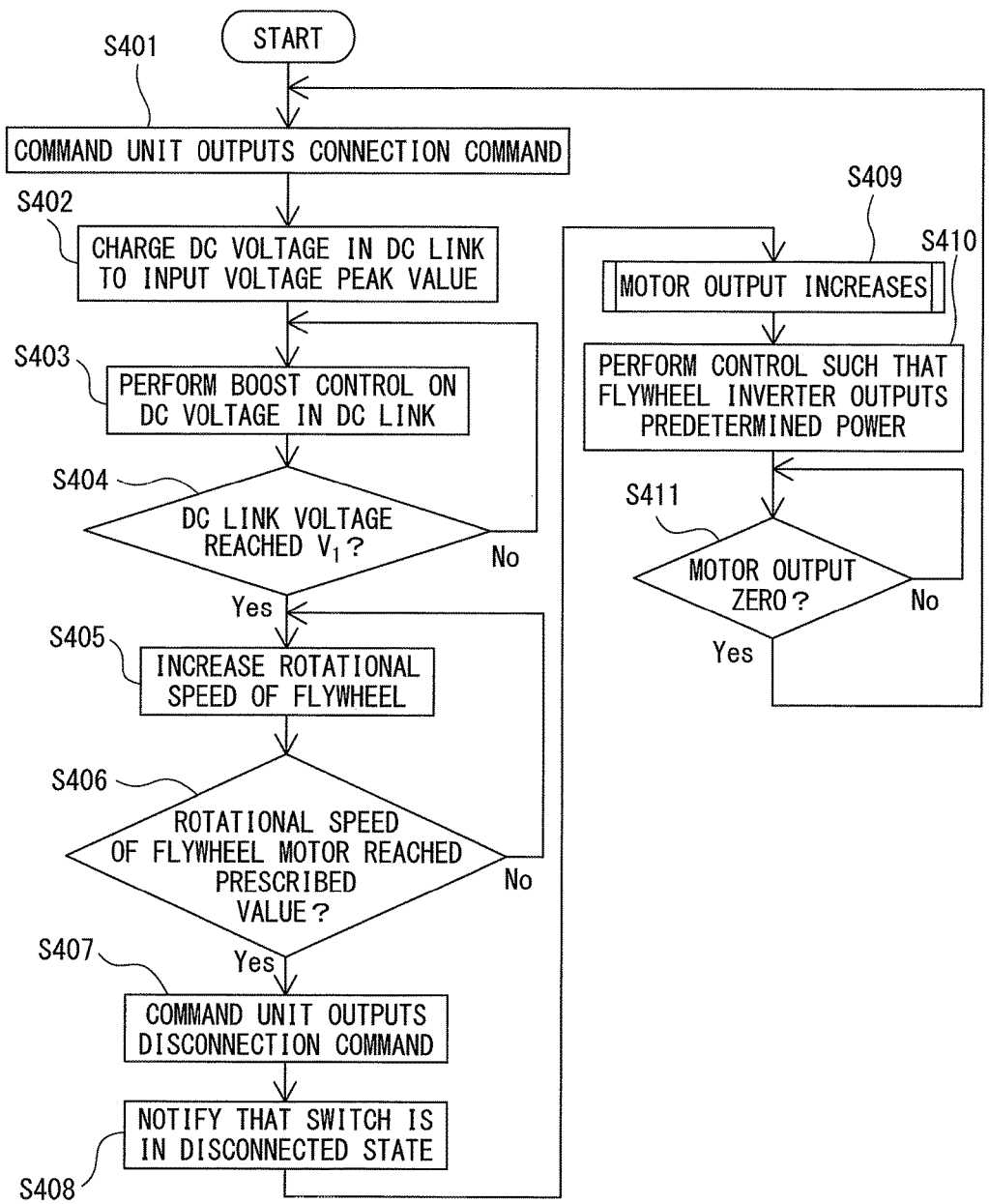
FIG. 8 is a flow chart illustrating operational flow of the motor driving device according to the fourth example.

FIG. 8 is a flow chart illustrating operational flow of the motor driving device according to the fourth example. In the fourth example, the flywheel control circuit 44 controls, after the DC voltage in the DC link is boosted up to the prescribed voltage $V_1$, in a manner such that the flywheel inverter 53 outputs AC power for driving the flywheel motor 52 so as to rotate the flywheel 51 at a prescribed rotational speed. Then, the flywheel control circuit 44 controls, after the command unit 15 initiates outputting the disconnection command to the switch 14, in a manner such that the flywheel inverter 53 converts AC power equivalent to the AC power necessary for driving the motor 2 to DC power until the rotational energy of the flywheel 51 is eliminated.

In activation of the motor driving device 1, firstly at step S401, the command unit 15 outputs a connection command to the switch 14. Outputting of the connection command by the command unit 15 at the time of activation of the motor driving device 1 is executed in response to receiving a notification of activation of the motor driving device 1 from the host controller 41. Upon reception of the connection command from the command unit 15, the switch 14 establishes the connection between the AC power supply 3 and the PWM converter 11. Since being not PWM-controlled at this time point, the PWM converter 11 operates merely as a diode rectifier and diode-rectifies the AC current flowing thereinto from the AC power supply 3 to output a DC current to the DC link.

The DC voltage in the DC link (i.e. the DC voltage applied to the power storage unit) gradually increases, and when charged to the input voltage peak value (step S402), the converter control circuit 42 initiates PWM control on the PWM converter 11 in order to control the boosting of the DC voltage in the DC link at step S403. The PWM converter 11 converts AC power on the AC power supply 3 side to DC power in the DC link, by being PWM-controlled in a manner such that the power supply current (AC current) to be fed from the AC power supply 3 does not exceed the input current limit value, and the DC voltage in the DC link is further boosted up to a voltage equal to or more than the input voltage peak value.

At step S404, the converter control circuit 42 determines whether or not the DC voltage in the DC link detected by the DC voltage/current detecting unit 21 has reached the prescribed voltage $V_1$ prescribed in advance. If the DC voltage in the DC link has reached the prescribed voltage $V_1$, processing proceeds to step S405.

At step S405, the flywheel control circuit 44 PWM-controls switching operations of the semiconductor switching elements in the flywheel inverter 53 so that the flywheel inverter 53 converts DC power in the DC link to AC power for driving the flywheel motor 52. Consequently, the flywheel motor 52 is driven by the AC power output from the flywheel inverter 53, resulting in the rotation of the flywheel 51 coupled to the rotational shaft of the flywheel motor 52. In other words, in the flywheel power storage device 13-2, the DC power in the DC link is converted to the rotational energy for the flywheel 51 and is stored.

Next, at step S406, the flywheel control circuit 44 determines whether or not the rotational speed of the flywheel 51 has reached the prescribed rotational speed. The rotational speed of the flywheel 51 is detected by a rotation sensor (not illustrated), and the flywheel control circuit 44 uses the rotational speed thus detected to determine whether or not the prescribed rotational speed has been reached. If the rotational speed of the flywheel 51 has reached the prescribed rotational speed, processing proceeds to step S407.

At step S407, the command unit 15 outputs a disconnection command to the switch 14. Upon reception of the disconnection command from the command unit 15, the switch 14 disconnects between the AC power supply 3 and the PWM converter 11. As a result, the power supply current (AC current) from the AC power supply 3 does not flow into the PWM converter 11.

Next, at step S408, the command unit 15 notifies the host controller 41 that the switch 14 is in a disconnected state.

Upon reception of the notification that the switch 14 is in the disconnected state, the host controller 41 outputs a motor output increase command to the inverter control circuit 43. Consequently, the inverter control circuit 43 increases the output of the inverter 12 by PWM control. At this time, in order to convert the rotational energy stored in the flywheel 51 to electric energy, the flywheel control circuit 44 controls power conversion operation of the flywheel inverter 53 in a manner such that the flywheel motor 52 coupled to the flywheel 51 is decelerated to generate a regenerative power, and the regenerated power is converted to DC power and the DC power is returned to the DC link. As a result, the DC power in the DC link obtained from the rotational energy converted in the flywheel power storage unit 13-2 is converted by the inverter 12 to AC power for supplying to the motor 2, resulting in that the motor 2 is driven by the AC power and the output of the motor 2 increases (step S409). Since the AC power supply 3 and the PWM converter 11 are disconnected at this time, the power supply current (AC current) from the AC power supply 3 does not flow into the PWM converter 11 and the DC voltage in the DC link gradually decreases, as has been described above.

At step S410, the flywheel control circuit 44 controls in a manner such that the flywheel inverter 53 converts AC power equivalent to the AC power necessary for driving the motor 2 to DC power until the rotational energy of the flywheel 51 is eliminated.

Next, at step S411, the command unit 15 determines whether or not the motor output is zero based on a signal from the host controller 41. If the motor output is zero, processing returns to step S401, and the command unit 15 outputs a connection command to the switch 14. Upon reception of the connection command from the command unit 15, the switch 14 establishes the connection between the AC power supply 3 and the PWM converter 11. Hereinafter the processing in each step described above is repeated. Incidentally, if it is determined that the motor output is zero at step S411, the command unit 15 outputs the connection command to the switch 14 for re-connecting between the AC power supply 3 and the PWM converter 11 at step S401, but the re-connection may be performed as a modification when the motor output is other than zero if the switch 14 is durable against inrush current that may flow at the time of the re-connection.

In the above described first to fourth examples, the command unit 15 is provided in the converter control circuit 42, but the command unit 15 may be provided as a modification separately from the converter control circuit 42. A case where the command unit 15 is provided separately from the converter control circuit 42 in the first and second examples will be described as an example, but this can be also applicable similarly to the third and fourth examples.

Figure 9:
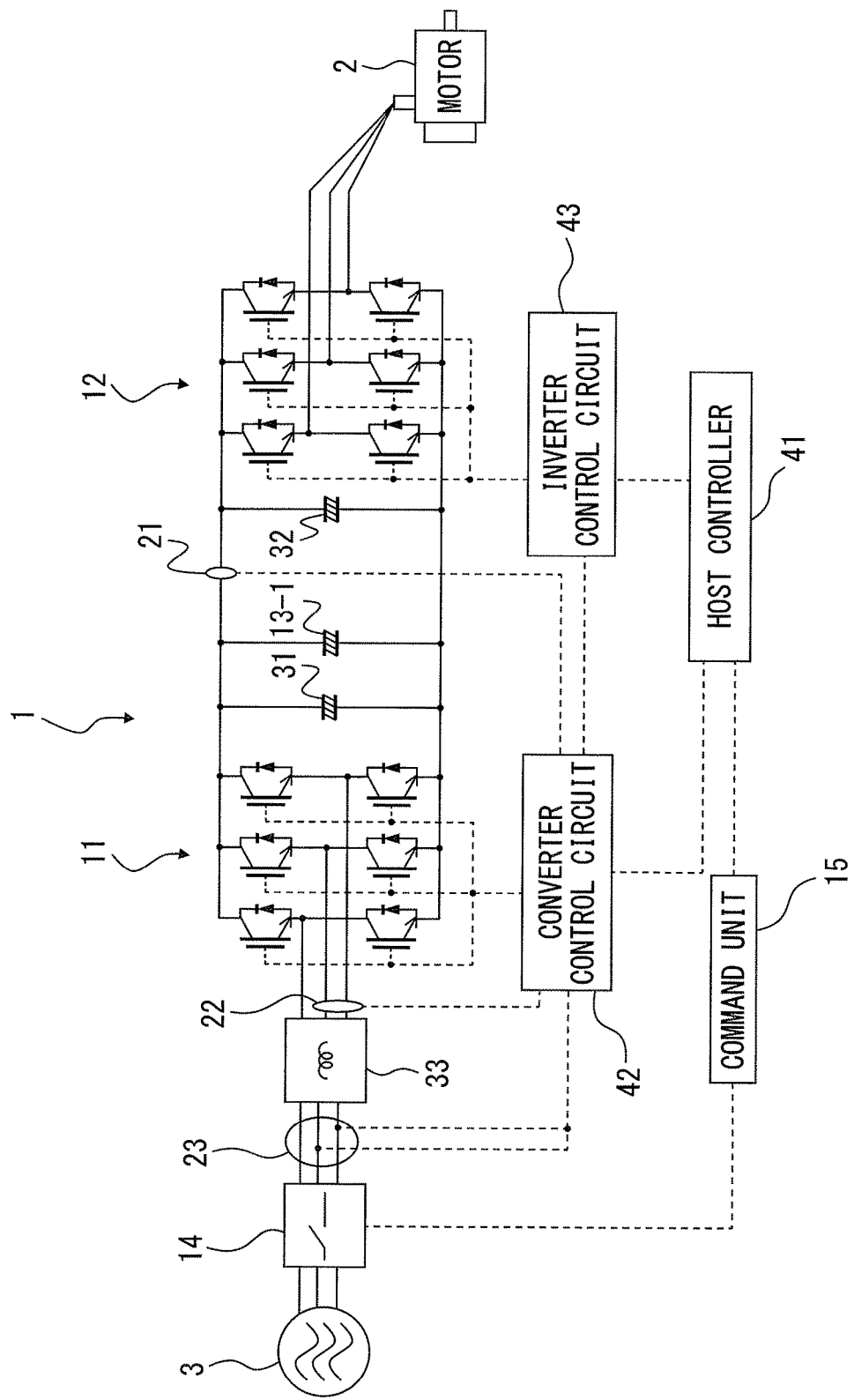
FIG. 9 is a circuit diagram illustrating a motor driving device according to a modification of the first and second examples.
Figure 10A:
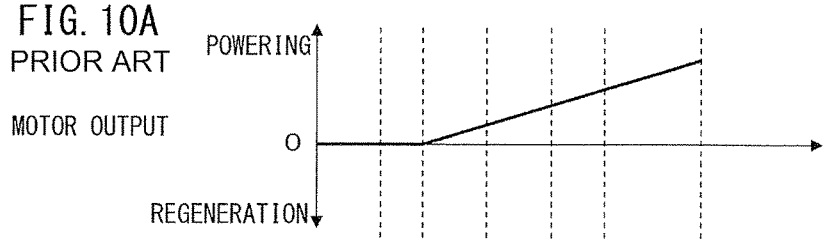
FIG. 10A is a diagram illustrating operation of a conventional motor driving device having a power storage device and a PWM converter that is provided in order to suppress the peaks of power to be supplied from the power supply during acceleration of the motor and the peaks of power to be regenerated to the power supply during deceleration of the motor, the diagram indicating a motor output.
Figure 10B:
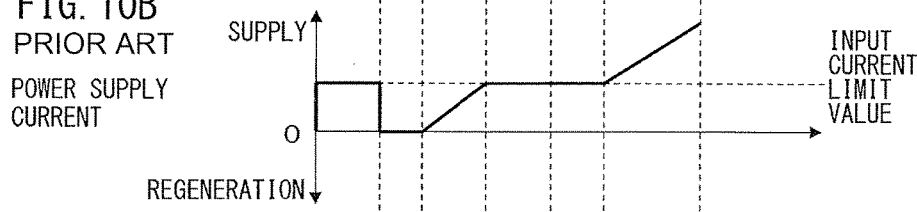
FIG. 10B is a diagram illustrating operation of the conventional motor driving device having a power storage device and a PWM converter that is provided in order to suppress the peaks of power to be supplied from the power supply during acceleration of the motor and the peaks of power to be regenerated to the power supply during deceleration of the motor, the diagram indicating a power supply current to be fed from the AC power supply to the PWM converter.
Figure 10C:
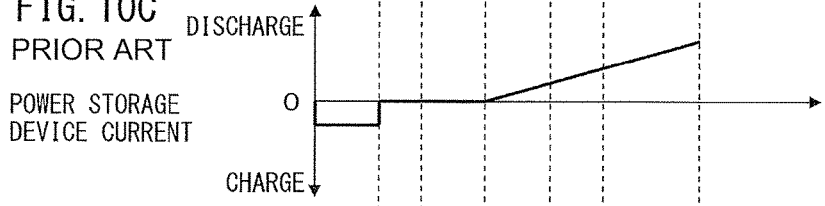
FIG. 10C is a diagram illustrating operation of the conventional motor driving device having a power storage device and a PWM converter that is provided in order to suppress the peaks of power to be supplied from the power supply during acceleration of the motor and the peaks of power to be regenerated to the power supply during deceleration of the motor, the diagram indicating current flow in the power storage device.
Figure 10D:
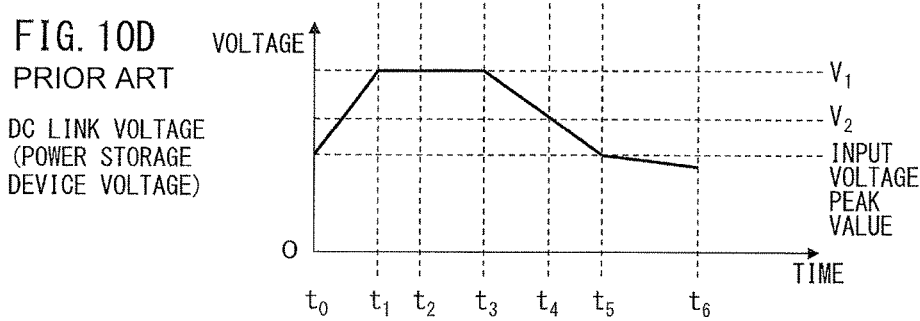
FIG. 10D is a diagram illustrating operation of the conventional motor driving device having a power storage device and a PWM converter that is provided in order to suppress the peaks of power to be supplied from the power supply during acceleration of the motor and the peaks of power to be regenerated to the power supply during deceleration of the motor, the diagram indicating a DC link voltage.

FIG. 9 is a circuit diagram illustrating a motor driving device according to a modification of the first and second examples. As illustrated in FIG. 9, the command unit 15 is provided between the host controller 41 and the switch 14. The command unit 15 may be configured of, for example, a programmable logic controller (PLC), and the functions of the command unit 15 described above may be programmed in a programmable memory in the programmable logic controller for operation.

The present invention achieves a motor driving device that converts by a PWM converter AC power supplied from the AC power supply side to DC power and outputs the DC power to a DC link where a power storage unit is provided, and thereafter, further converts the DC power to AC power for motor driving and supplies the AC power to a motor, wherein a capacity of the PWM converter and a capacity of the power storage unit are reduced, and elements each constituting the PWM converter and the power storage unit are surely protected from overcurrents.

According to the present invention, after the DC voltage in the DC link is boosted up to a prescribed voltage, the AC power supply and the PWM converter are disconnected, and therefore, even if the motor is accelerated at this time, no power supply current flows into the PWM converter. In other words, even if the DC voltage in the DC link is equal to or less than an input voltage peak value, there is no current flowing into the diodes in the PWM converter as has conventionally been the case, and therefore breakage of the diodes in the PWM converter or the power storage unit due to overcurrents may not occur and the motor driving device itself may not be stopped by alarm. Consequently, according to the present invention, it is possible to drive the motor without being affected by the input voltage peak value and to make a selection of the small-capacity PWM converter. In addition, according to the motor driving device of the present invention, since it is possible to set the minimum voltage necessary for driving the motor to a value smaller than the input voltage peak value, a difference between the DC voltages in the DC link before and after the supply of the driving power for the motor from the power storage device can be made larger than is conventional. As a result, if a capacitor is employed as the power storage unit, for example, it is possible to reduce the capacitance compared with the conventional case.

What is claimed is:
1. A motor driving device comprising:
a PWM converter that performs power conversion between AC power on an AC power supply side and DC power in a DC link by PWM control;
an inverter that converts, during powering operation, the DC power in the DC link to AC power for motor driving and supplies the AC power to a motor, and that converts, during regenerative operation, the AC power regenerated in the motor to DC power and returns the DC power to the DC link;
a power storage unit that is provided in the DC link and may store DC power;
an AC power supply switch that connects or disconnects an AC power supply to or from the PWM converter in response to a received command; and
a command unit that:
continues outputting a connection command to the AC power supply switch while a DC voltage in the DC link is boosted up to a prescribed voltage resulting from the DC power being stored in the power storage unit, the DC power having been obtained from the AC power converted by the PWM converter in a manner such that an AC current to be fed from the AC power supply does not exceed a preset input current limit value, initiates outputting a disconnection command to the AC power supply switch after the DC voltage in the DC link reaches the prescribed voltage and before the inverter initiates powering operation, and continues outputting the disconnection command to the AC power supply switch when the inverter initiates the powering operation and supplies the AC power to the motor.

2. The motor driving device according to claim 1, wherein, when the DC voltage in the DC link drops and output from the inverter decreases from a peak value after initiation of outputting the disconnection command to the AC power supply switch, the command unit ends outputting the disconnection command to the AC power supply switch to initiate outputting the connection command to the AC power supply switch.

3. The motor driving device according to claim 1, wherein the power storage unit is a capacitor.

4. A motor driving device comprising:
a PWM converter that performs power conversion between AC power on an AC power supply side and DC power in a DC link by PWM control;
an inverter that converts, during powering operation, the DC power in the DC link to AC power for motor driving and supplies the AC power to a motor, and that converts, during regenerative operation, the AC power regenerated in the motor to DC power and returns the DC power to the DC link;
a power storage unit that is provided in the DC link and may store DC power;
a switch that connects or disconnects between an AC power supply and the PWM converter in response to a received command; and
a command unit that continues outputting a connection command to the switch while a DC voltage in the DC link is boosted up to a prescribed voltage resulting from the DC power being stored in the power storage unit, the DC power having been obtained from the AC power converted by the PWM converter in a manner such that an AC current to be fed from the AC power supply does not exceed a preset input current limit value, and that initiates outputting a disconnection command to the switch after the DC voltage in the DC link reaches the prescribed voltage and before the inverter initiates powering operation, wherein the power storage unit comprises:
a flywheel that may store rotational energy,
a flywheel motor having a rotational shaft to which the flywheel is coupled,
a flywheel inverter that performs power conversion between DC power in the DC link and AC power on the flywheel motor side, and
a flywheel control unit that controls power conversion operation of the flywheel inverter.

5. The motor driving device according to claim 4, wherein the flywheel control unit
controls, after the DC voltage in the DC link is boosted up to the prescribed voltage, in a manner such that the flywheel inverter outputs AC power for driving the flywheel motor so as to rotate the flywheel at a prescribed rotational speed; and
controls, after the command unit initiates outputting the disconnection command to the switch, power conversion operation of the flywheel inverter until the rotational energy of the flywheel is eliminated in a manner such that the DC voltage in the DC link becomes equal to or more than a voltage necessary for enabling power conversion by the inverter from DC power to AC power but not more than the prescribed voltage.

6. The motor driving device according to claim 4, wherein the flywheel control unit
controls, after the DC voltage in the DC link is boosted up to the prescribed voltage, in a manner such that the flywheel inverter outputs AC power for driving the flywheel motor so as to rotate the flywheel at the prescribed rotational speed; and
controls, after the command unit initiates outputting the disconnection command to the switch, in a manner such that the flywheel inverter converts AC power equivalent to the AC power necessary for driving the motor to DC power until the rotational energy of the flywheel is eliminated.

* * * * *